(12) United States Patent
Oka (10) Patent No.: US 11,543,593 B2
(45) Date of Patent: Jan. 3, 2023

(54) OPTICAL DEVICE, AND LIGHT SOURCE MODULE USING THE SAME

(71) Applicant: Fujitsu Optical Components Limited, Kawasaki (JP)

(72) Inventor: Akira Oka, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 17/177,488

(22) Filed: Feb. 17, 2021

(65) Prior Publication Data
US 2021/0263220 A1     Aug. 26, 2021

(30) Foreign Application Priority Data

Feb. 26, 2020   (JP) .............................. JP2020-030837

(51) Int. Cl.
| | | |
|---|---|---|
| G02B 6/125 | (2006.01) |
| G02B 6/30 | (2006.01) |
| G02B 6/293 | (2006.01) |
| G02B 6/12 | (2006.01) |

(52) U.S. Cl.
CPC ............ *G02B 6/305* (2013.01); *G02B 6/125* (2013.01); *G02B 6/12007* (2013.01); *G02B 6/29395* (2013.01)

(58) Field of Classification Search
None
See application file for complete search history.

(56) References Cited

U.S. PATENT DOCUMENTS

| | | | |
|---|---|---|---|
| 5,165,001 A | 11/1992 | Takagi et al. | |
| 2015/0139264 A1* | 5/2015 | Zhang | H01S 5/1032 372/107 |
| 2020/0209472 A1* | 7/2020 | Roth | G02B 6/4207 |

FOREIGN PATENT DOCUMENTS

| | | |
|---|---|---|
| JP | 4-212108 | 8/1992 |
| JP | 4-212109 | 8/1992 |

OTHER PUBLICATIONS

David B. Mortimore, "Fiber Loop Reflectors," Journal of Lightwave Technology, vol. 6, No. 7, pp. 1217-1224, Jul. 1988.
Qing Fang et al., "Folded Silicon-Photonics Arrayed Waveguide Grating Integrated with Loop-Mirror Reflectors," IEEE Photonics Journal, vol. 10, No. 4, Aug. 2018 (9 pp.).
Luhua Xu et al., "Compact high-performance adiabatic 3-dB coupler enabled by subwavelength grating slot in the silicon-on-insulator platform," Optics Express, vol. 26, No. 23, pp. 29873-29885 (2018).

* cited by examiner

*Primary Examiner* — Chad H Smith
(74) *Attorney, Agent, or Firm* — Staas & Halsey LLP

(57) ABSTRACT

An optical device has a first photonic waveguide provided on a substrate, a second photonic waveguide provided on the substrate and extending side by side with the first photonic waveguide, and a looped waveguide continuously connecting the first photonic waveguide and the second photonic waveguide on the substrate, wherein a width of at least one of the first photonic waveguide or the second photonic waveguide varies continuously along an optical axis, between a first position located at a side opposite to the looped waveguide and a second position connected to the looped waveguide, and wherein cross sections of the first photonic waveguide and the second photonic waveguide are congruent at the second position, and are incongruent at the first position.

10 Claims, 10 Drawing Sheets

I-I' CROSS-SECTION

FIG.4

FIG.5A
POSITION: P0

FIG.5B
POSITION: P6

FIG.5C
POSITION: P8

FIG.6

FIG.7A
POSITION: P0

FIG.7B
POSITION: P6

FIG.7C
POSITION: P8

OPTICAL DEVICE, AND LIGHT SOURCE MODULE USING THE SAME

CROSS-REFERENCE TO RELATED APPLICATIONS

This application is based upon and claims priority to earlier filed Japanese Patent Application No. 2020-030837 filed Feb. 26, 2020, which is incorporated herein by reference in its entirety.

FIELD

The present disclosure relates to an optical device and a light source module using the same.

BACKGROUND

In fiber optic communication, wavelength division multiplexing (WDM) is used to increase the amount of data transmitted over a single optical fiber. In WDM, respective data transfers are allocated to different wavelength channels, and the data channels are simultaneously transmitted through the optical fiber. In order to perform WDM, a tunable laser diode (TLD) whose oscillation wavelength is controllable is used where transmission is performed.

In a TLD, many optical devices including a tunable filter, a reflector, and so on are integrated together with a gain medium onto a chip so as to reduce the size and power consumption. It is desirable for a TLD to have less optical return loss and less wavelength dependence over the operable wavelength band. The same properties are demanded for optical devices as well used in the TLD.

A loop mirror is one of the reflectors. In general, a loop mirror is formed of a Y-branch coupler and a looped waveguide connecting the branched waveguide portions of the Y-branch coupler. The Y-branch coupler is implemented by a directional coupler, a multimode interferometer (MMI), or the like.

A fiber loop mirror using an optical fiber that is formed into a directional coupler and a looped waveguide is known. See, for example, Non-Patent Document 1 presented below. An on-chip loop mirror fabricated by silicon photonics technology on a substrate, using a 1×2 (1-input and 2-output) MMI as the Y-branching waveguides, is also known. See, for example, Non-Patent Document 2 presented below.

An optical waveguide branching device utilizing two-mode interference, in which a tapered waveguide is provided in a parallel coupling region of a directional coupler, is known. See, for example, Patent Documents 1 to 3 presented below. A 3-dB coupler making use of adiabatic conversion of one mode is also known. See, for example, Non-Patent Document 3 presented below.

A directional coupler splits or combines light wave using interference between even and odd modes. An MMI coupler splits or combines light wave(s) using the interference between multiple modes existing in a waveguide. Optical loss is likely to occur because a loop mirror using a directional coupler or a MMI coupler is configured to split incident light making use of interference of light, and because the interference changes when the wavelength varies.

It is desired for an optical device formed of a photonic waveguide on a substrate to have a configuration that can reduce optical return loss and wavelength dependence over the entirety of the operative wavelength band.

Patent and Non-Patent Documents

Patent DCMT 1: Japanese Patent Application Laid-open Publication No. H04-212108

Patent DCMT 2: Japanese Patent Application Laid-open Publication No. H04-212109

Patent DCMT 3: U.S. Pat. No. 5,165,001

Non-PTNT DCMT 1: David B. Mortimore, "Fiber Loop Reflectors," Journal of Lightwave Technology, Vol. 6, No. 7, July 1988

Non-PTNT DCMT 2: Qing Fang, et al., "Folded Silicon-Photonics Arrayed Waveguide Grating Integrated with Loop-Mirror Reflectors," IEEE Photonics Journal, Vol. 10, No. 4, August 2018

Non-PTNT DCMT 3: Luhua Xu, et al., "Compact high-performance adiabatic 3-dB coupler enabled by subwavelength grating slot in the silicon-on-insulator platform," Optics Express, Vol. 26, No. 23, p.p. 29873-29885 (2018)

SUMMARY

According to one aspect of the disclosure, an optical device includes a first photonic waveguide provided on a substrate, a second photonic waveguide provided on the substrate and extending side by side with the first photonic waveguide, and a looped waveguide continuously connecting the first photonic waveguide and the second photonic waveguide on the substrate, wherein a width of at least one of the first photonic waveguide or the second photonic waveguide varies continuously along an optical axis, between a first position located at a side opposite to the looped waveguide and a second position connected to the looped waveguide, and wherein cross sections of the first photonic waveguide and the second photonic waveguide are congruent at the second position, and are incongruent at the first position.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

DESCRIPTION OF EMBODIMENTS

Prior to describing the particulars of an optical device of an embodiment, explanation is made to a technical problem arising when a known fiber loop mirror is reconfigured as an on-chip photonic loop mirror formed of a photonic waveguide on a substrate.

Figure 1:
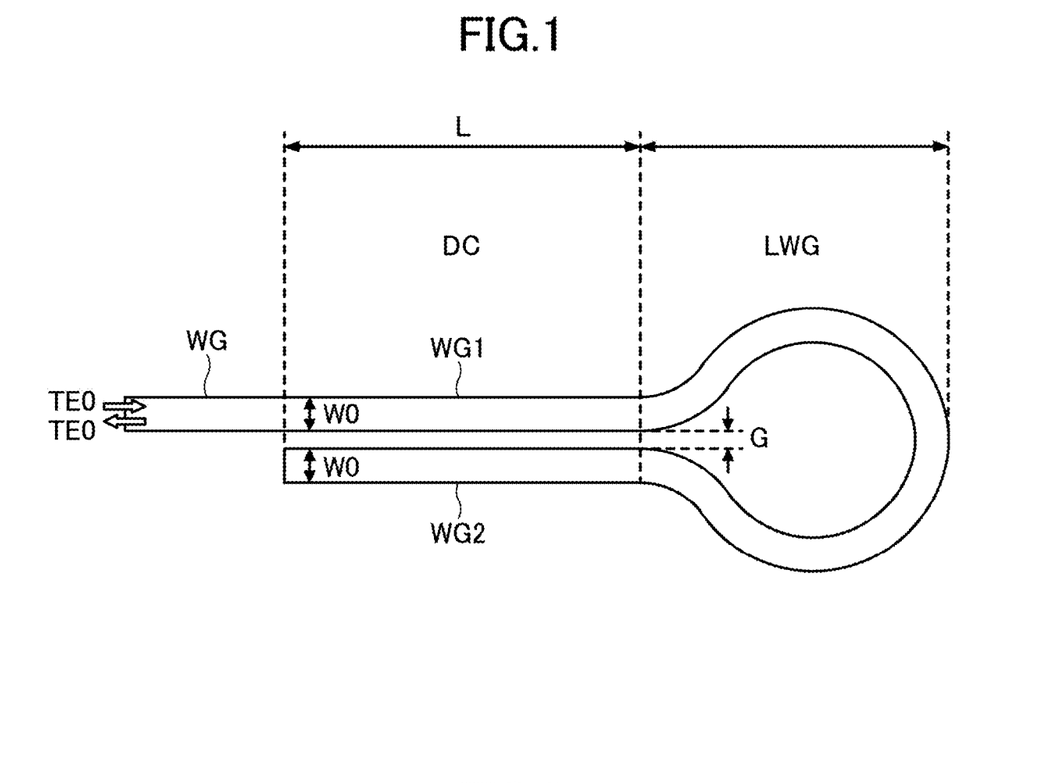
FIG. 1 is a diagram explaining a technical problem arising when a fiber loop mirror is reconfigured as an on-chip loop mirror formed of a photonic waveguide on a substrate.

FIG. 1 illustrates a configuration in which a fiber loop mirror using a directional coupler is reconfigured as a photonic waveguide loop mirror formed on a substrate. The photonic waveguide loop mirror of FIG. 1 includes a directional coupler (labeled as "DC" in the figure), and a looped waveguide (labeled as "LWG" in the figure) that continues from the directional coupler, as in the know structure of a fiber loop mirror. In the directional coupler, the photonic waveguide segments WG1 and WG2 are provided closely and parallel to each other over a predetermined length (L). The photonic waveguide WG, including the photonic waveguides segments WG1 and WG2, has the same height and the same width "W0" over the entirety of the loop mirror, as dose a typical fiber core.

The photonic waveguide WG is made of a high refractive index material such as silicon (Si), and is surrounded by a clad made of a lower refractive index material. Incident light travels through the photonic waveguide WG while undergoing total internal reflection at the interface with the clad. In the directional coupler, light can be coupled from one photonic waveguide WG1 to the other photonic waveguide WG2 by evanescent coupling, which is a phenomenon making use of the electromagnetic field incident onto the cladding. The gap G between the photonic waveguides WG1 and WG2 is set to an appropriate value to allow evanescent coupling.

The directional coupler is configured to split and combine light wave(s) using interference of two modes, even mode and odd mode, generated at the input port (the left end of the directional coupler in FIG. 1). Even-mode wave and odd-mode wave travel at different propagation constants, and the phase velocities vary as they propagate. The photonic waveguides WG1 and WG2 are designed to have a coupling length L transferring 50% of the power of the incident light from one photonic waveguide WG1 to the other photonic waveguide WG2. One half or 50% of the light travels around the looped waveguide clockwise and is guided to the photonic waveguide WG2. The other half or the remaining 50% of the light travels counterclockwise through the looped waveguide and is guided to the photonic waveguide WG1. The light waves having returned to the waveguides WG1 and WG2 travel on the reverse paths through the directional coupler, in a direction opposite to the input path to the looped waveguide, and are finally output from the photonic waveguide WG1.

When the wavelength of light changes, the effective optical path lengths of the photonic waveguides WG1 and WG2, through which even and odd modes travel, also change. As a result, a certain portion of the optical power of the light having passed through the looped waveguide may remain in the photonic waveguide WG2 at the input end of the directional coupler, and the optical loss may vary. Therefore, it is difficult for the configuration of FIG. 1 to achieve low optical loss and low wavelength dependence over a broad wavelength band.

Figure 2:
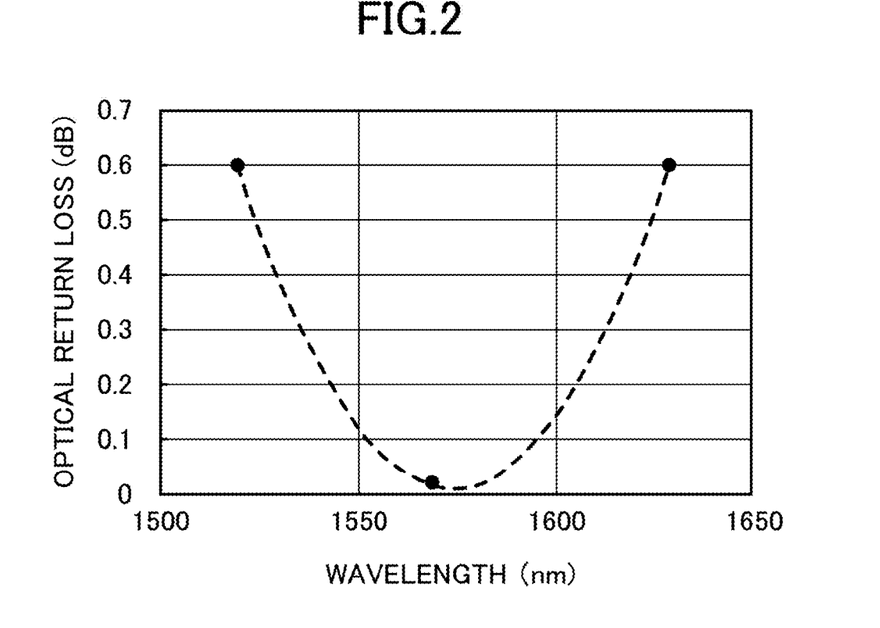
FIG. 2 illustrates wavelength dependence of optical return loss of the loop mirror of FIG. 1.

FIG. 2 illustrates wavelength dependency of optical return loss in the configuration of FIG. 1. The optical return loss is defined as a ratio of reflected light power $P_{REF}$ to the incident light power $P_{IN}$ ($P_{REF}/P_{IN}$). In FIG. 2, calculation is made assuming that a waveguide is formed of Si core surrounded by $SiO_2$ clad, and that the height of the core (i.e., the photonic waveguide WG) is 220 nm, the width is 400 nm, the gap G between the parallel cores is 200 nm, and the length L along the optical axis of the directional coupler is 12.55 microns (μm). The wavelengths along the horizontal axis cover the range of 1520 to 1630 nm, covering the C-band and L-band used in WDM of backbone networks.

Due to the change in wavelength, the maximum optical return loss is as much as 0.61 dB. The wavelength dependence of the optical return loss, that is, the ratio of the maximum loss to the minimum loss is 0.60 dB. It is understood that if the conventional fiber loop mirror is applied as it is to a photonic waveguide structure on a substrate, both optical return loss and wavelength dependence increase.

The optical return loss and the wavelength dependency also occur when Y-branching is implemented using an MMI operating based on multimode interference.

Optical Device of Embodiment

Figure 3A:
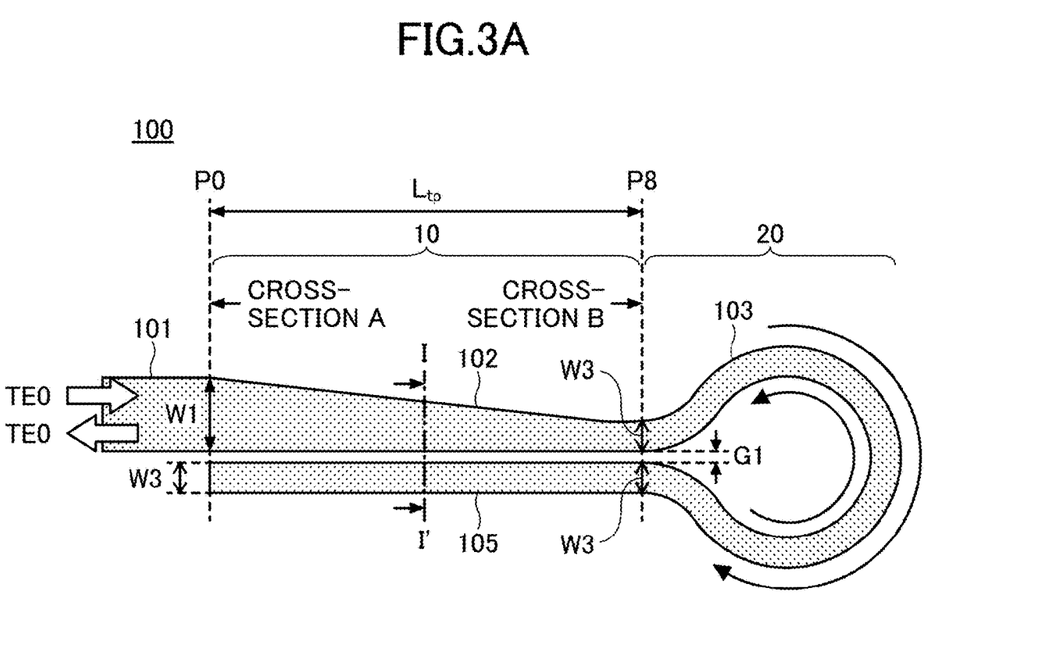
FIG. 3A is a schematic plan view of an optical device according to an embodiment.
Figure 3B:
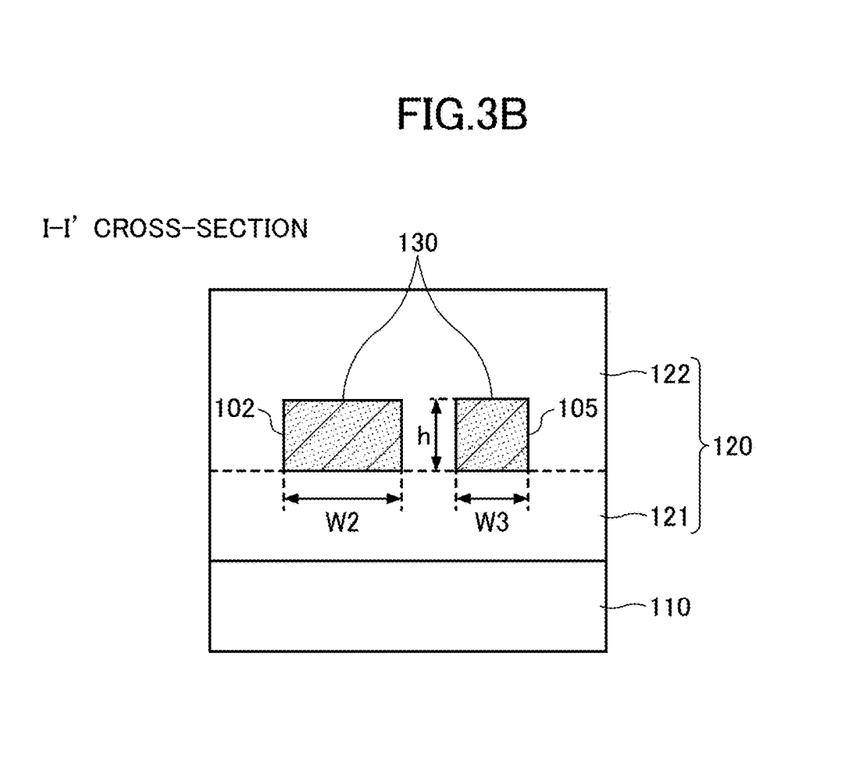
FIG. 3B is a cross-sectional view of the optical device taken along the I-I' line in FIG. 3A.

FIG. 3A and FIG. 3B illustrate an example configuration of an optical device 100 according to an embodiment. FIG. 3A is a plan view, and FIG. 3B is a cross-sectional view taken along the I-I' line of FIG. 3A.

The optical device 100 is an on-chip loop mirror formed of a photonic waveguide on a substrate 110. The photonic waveguide is formed as a core 130 surrounded by a clad 120, in this example. There are no particular limitations on the materials used for the core 130 and the clad 120 as long as a sufficient refractive index difference is provided between the core 130 and the clad 120 so as to efficiently confine the light of a target wavelength. In one example, the core 130 is formed of Si and the clad 120 is formed of $SiO_2$. This combination of materials provides a large refractive index difference achieving strong light confinement, and advantageously enables reduction in the size of the device.

Of the clad 120, a lower clad 121 close to the substrate 110 may be a silicon oxide layer formed in advance in an SOI wafer. Of the clad 120, an upper clad 122 may be an air layer in place of the SiO$_2$ layer.

The optical device 100 has an adiabatic coupler 10 and a loop 20 connected to the adiabatic coupler 10. The adiabatic coupler 10 is an optical coupler that makes use of adiabatic transform of one mode, unlike the conventional directional coupler using interference of two modes, and is named "adiabatic coupler 10" for convenience sake to distinguish it from the conventional directional coupler. As will be described later, adiabatic transform is a process of transforming the state while maintaining the same propagating mode, without transferring power or energy of one propagating mode. The adiabatic coupler 10 may be connected to another optical circuit device by a photonic waveguide segment 101 on a side opposite to the loop 20. The photonic waveguide segment 101 may be a constant-width waveguide.

The adiabatic coupler 10 is formed of a photonic waveguide segment 102 and a photonic waveguide segment 105 extending side by side with the photonic waveguide segment 102. In this example, the photonic waveguide segment 102 is tapered such that the width changes continuously along the optical axis, and the photonic waveguide segment 105 has a constant width W3. The photonic waveguide segments 102 and 105 may be formed into appropriate tapered shapes as long as at least one of the photonic waveguide segment 102 or the photonic waveguide segment 105 extends to a position connected to the loop 20, while continuously changing the width. The photonic waveguide segments 102 and 105 are provided side by side and close to each other with a gap G1 between them.

The loop 20 is formed of a looped waveguide 103 that connects the photonic waveguide segments 102 and 105. The looped waveguide 103 has a constant width W3 and is curved with a predetermined radius of curvature R.

The adiabatic coupler 10 is designed such that the power of the propagating mode of the incident light is divided at a 50/50 split ratio at the cross-sectional position B connected to the loop 20. Specifically, the width of the photonic waveguide segment 102 changes continuously and gradually in the direction of light propagation or along the optical axis to form a tapered waveguide.

At the cross-sectional position A where an input/output end of the adiabatic coupler 10 is located, the cross-sectional shapes of the photonic waveguide segments 102 and 105 are different. At the cross-sectional position B connected to the loop 20, the cross-sectional shapes and the sizes of the photonic waveguide segments 102 and 105 become the same. At the I-I' cross-section located between the cross-sectional position A and the cross-sectional position B, the core cross-sections of the photonic waveguide segments 102 and 105 are still different, but the difference is smaller than that at the cross-sectional position A.

It is assumed that the height "h" of the photonic waveguide core constituting the optical device 100 is constant. At the cross-sectional position A, the width of the photonic waveguide segment 102 is W1. At the I-I' cross-section, the width of the photonic waveguide segment 102 is W2 (W2<W1). At the cross-sectional position B, the width of the photonic waveguide segment 102 is W3 (W3<W2), and is the same as width W3 of the photonic waveguide segment 105.

The physical length $L_{tp}$ of the adiabatic coupler 10 from the cross-sectional position A to the cross-sectional position B is sufficiently long such that the propagating mode of the light incident on the optical device 100 adiabatically transforms without being converted into another mode, and that the power ratio at the cross-sectional position B becomes 50 to 50.

In the example of FIG. 3A and FIG. 3B, TE0 mode light is incident to the tapered photonic waveguide segment 102, and the state gradually changes, while maintaining the TE0 mode, so that the electric field distribution of TE0 becomes 50 to 50 at the cross-sectional position B. In other words, half of the power of the TE0 mode light incident to the photonic waveguide segment 102 is adiabatically transferred to the photonic waveguide segment 105 during propagation through the adiabatic coupler 10. "Adiabatic transform" means that light travelling through a photonic waveguide segment 102 whose change is very gentle transits to the state at the cross-sectional position B, while maintaining the same propagating mode, without increasing or decreasing the total power or energy of the mode.

At the cross-sectional position B, the core shapes of the photonic waveguide segment 102 and the photonic waveguide segment 105 are identical, and the power levels of the light waves appearing in the two photonic waveguide segments are equal. The light component transmitted to the photonic waveguide segment 105 travels through the looped waveguide 103 counterclockwise, comes back to the cross-sectional position B, and is incident on the photonic waveguide segment 102. The light component remaining in the photonic waveguide segment 102 travels clockwise through the looped waveguide 103, comes back to the cross-sectional position B, and is incident on the photonic waveguide segment 105.

Since the TE0 light subjected to 50/50 split at the cross-sectional position B follows the same looped waveguide 103 in opposite directions, the split components of light having returned to the cross-sectional position B are kept in phase. The electric field distribution at the cross-sectional position B after circulating the looped waveguide 103 is the same as that of the light before incidence to the looped waveguide 103.

On the return path, the state of the TE0 light that travels in the opposite direction through the adiabatic coupler 10 adiabatically changes to the previous state of TE0 at the cross-sectional position A. The TE0 light is output from the cross-sectional position A to the photonic waveguide segment 101 at substantially the same power level as the input power of light incident on the optical device 100. As a result, the optical return loss at the optical device 100 is minimized.

Transition of the state between the cross-sectional position A and the cross-sectional position B of the adiabatic coupler 10 is an adiabatic transform that does not involve mode conversion. Accordingly, undesirable power loss which may happen due to power transfer to a different mode can be suppressed. Even when the wavelength varies, the mode is maintained in only one mode unlike with the conventional configurations disclosed in Non-Patent Documents 1 and 2, and thus, undesirable influence of interference change due to the change in the effective path length can be obviated. Also, since the optical phases of the two light components traveling through the same looped waveguide 103 in opposite directions match each other when they return to the cross-sectional position B, wavelength dependence of optical return loss can be suppressed.

Figure 4:
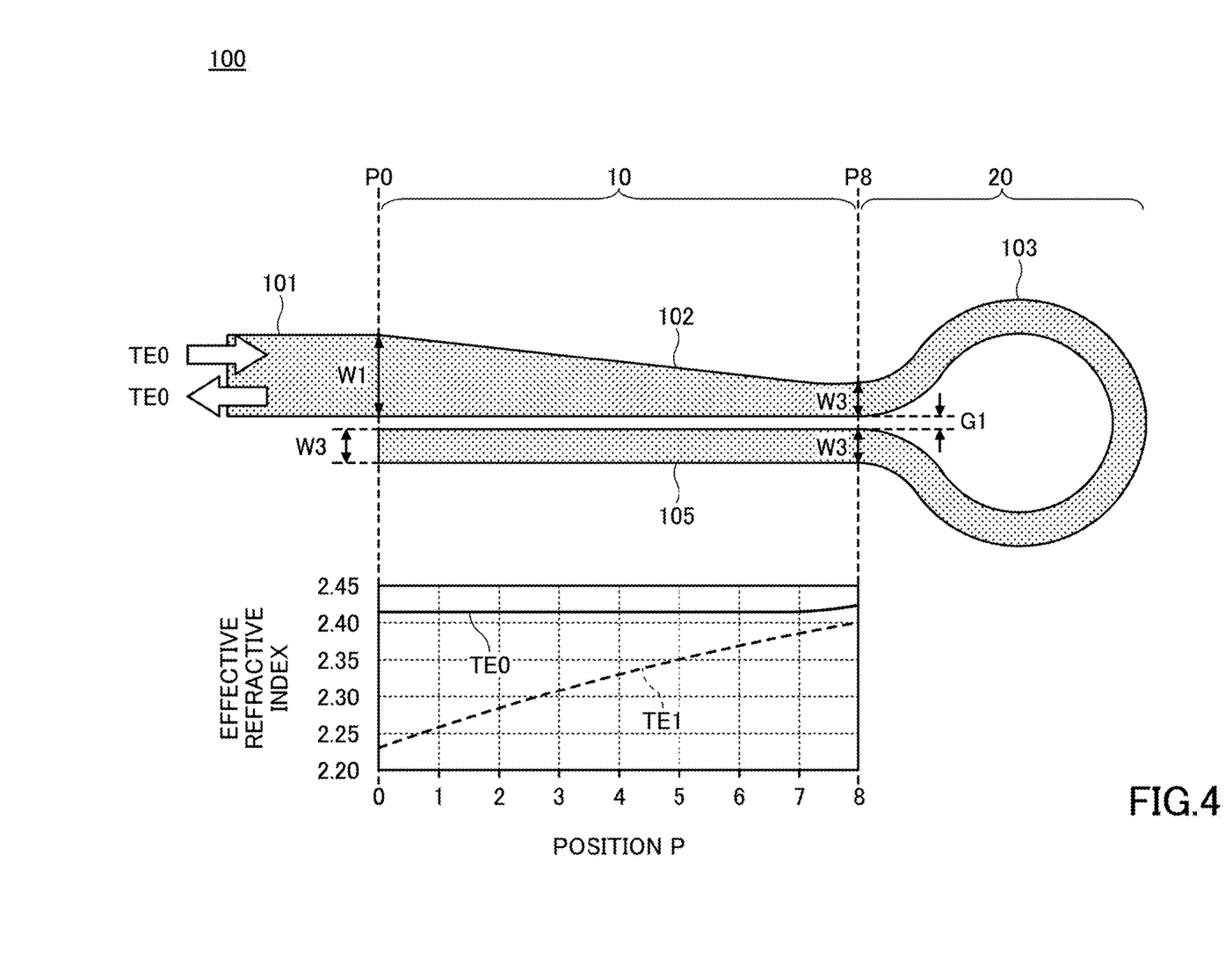
FIG. 4 is a diagram explaining the operating principle of the optical device of the embodiment.

FIG. 4 is another diagram for explaining the operating principle of the optical device 100 of the embodiment. In FIG. 4, the effective refractive index lines of TE0 mode and TE1 mode are illustrated from the position P0 to the position P8 of the adiabatic coupler 10. The position P0 corresponds to the cross-sectional position A of FIG. 3, whereas the position P8 corresponds to the cross-sectional position B of FIG. 3. The solid line represents the effective refractive index line of TE0 mode. The dashed line represents the effective refractive index line of TE1 mode as a reference.

The TE0 mode and the TE1 mode are the modes having the highest and the second highest effective refractive indexes respectively among the transverse electric modes in which the major component of the electric field oscillates transverse to the direction of propagation on the substrate (or in the width direction of the photonic waveguide core).

Parameters for calculating the effective refractive index line of the adiabatic coupler 10 are as follows. The height "h" of the Si core photonic waveguide is 220 nm, the width W1 of the photonic waveguide segment 102 at position P0 is 480 nm, the width W3 of the photonic waveguide segment 102 at position P8 is 400 nm, and the width W3 of the photonic waveguide segment 105 and the looped waveguide 103 is 400 nm. The radius of curvature "R" of the looped waveguide 103 is 5 µm, the gap G1 between the photonic waveguide segments 102 and 105 is 200 nm, and the length of the adiabatic coupler 10 along the optical axis is 12.55 µm.

In general, when the configuration of a photonic waveguide changes very gently, the propagating mode of incident light transitions along a continuous line of the effective index of refraction while maintaining the same mode (adiabatic transition). At position P0 of the adiabatic coupler 10, when TE0 mode light is incident on the photonic waveguide segment 102 from the photonic waveguide segment 101, the incident light can transition to a state at position P8, while maintaining the TE0 mode, along the effective refractive index line that is substantially constant and continuous. During the transition, there is almost no power transfer to a different mode.

After the light travels through the looped waveguide 103, the electric field distribution of the TE0 mode light that appears again at position P8 follows the effective refractive index line of the solid line in reverse, and transitions to the state of the TE0 electric field distribution at position P0. As a result, a TE0 mode light having almost the same power level as that of the incident light is output to the photonic waveguide segment 101.

Even if the light incident on the adiabatic coupler 10 contains a little TE1 mode, this can be disregarded for the following reasons. Because the effective refractive index for TE1 mode is lower than that for TE0 mode, the TE1 electric field is localized on the photonic waveguide segment 105 having a smaller cross-sectional size. Even when a TE1 mode light appears at the cross-sectional position B after circulation through the looped waveguide 103, the TE1 electric field is again localized on the photonic waveguide segment 105 on the return path from the cross-sectional position B to the cross-sectional position A, and the TE1 light does not interfere with the TE0 light transitioning to the TE0 distribution state at the cross-sectional position A.

Figure 5A:
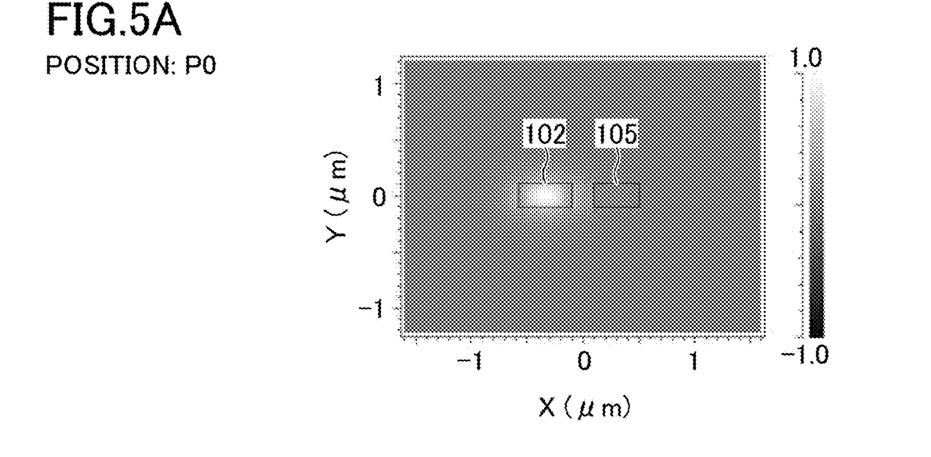
FIG. 5A illustrates a simulation result of the electric field distribution at position P0 of the adiabatic coupler of FIG. 3A.
Figure 5B:
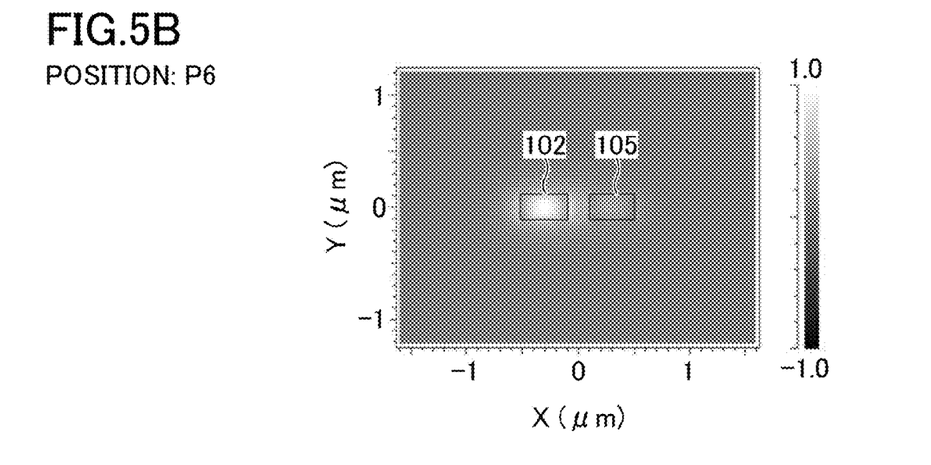
FIG. 5B illustrates a simulation result of the electric field distribution at position P6 of the adiabatic coupler of FIG. 3A.
Figure 5C:
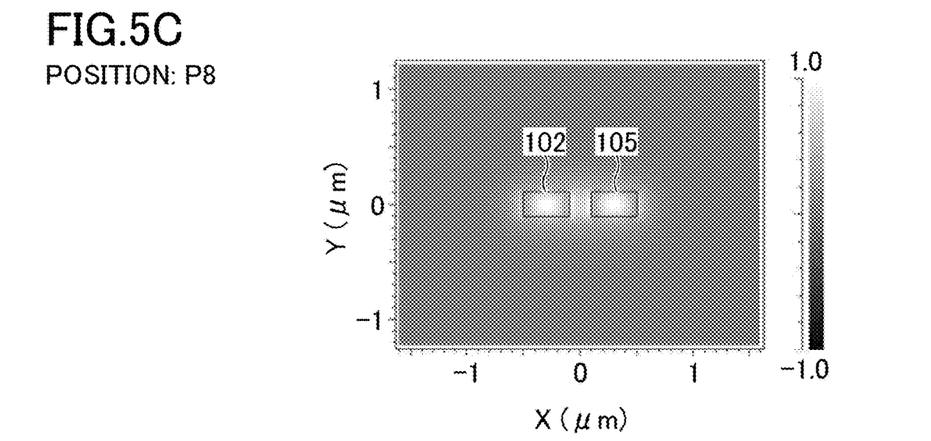
FIG. 5C illustrates a simulation result of the electric field distribution at position P8 of the adiabatic coupler of FIG. 3A.

FIG. 5A, FIG. 5B, and FIG. 5C are simulation results of the electric field distribution in the adiabatic coupler 10 at positions P0, P6, and P8, respectively. The simulation parameters are the same as those described with reference to FIG. 4. The cross sections of FIGS. 5A to 5C are viewed from the incident side of the adiabatic coupler 10, the left rectangle is the core of the tapered photonic waveguide segment 102, whereas the right rectangle is the core of the photonic waveguide segment 105 with a constant width.

At position P0 in FIG. 5A, the cross-sectional core size of the photonic waveguide segment 102 is greater than that of the photonic waveguide segment 105, and the TE0 electric field having a higher effective refractive index is localized on the photonic waveguide segment 102.

At position P6 in FIG. 5B, the width of the photonic waveguide segment 102 is closer to that of the photonic waveguide segment 105, and the evanescent light of TE0 at the core-clad interface of the photonic waveguide segment 102 is coupled to the photonic waveguide segment 105.

At position P8 in FIG. 5C, the cross-sectional shape and size of the photonic waveguide segment 102 are the same as those of the photonic waveguide segment 105. The TE0 electric field distributes evenly in the photonic waveguide segments 102 and 105, and the optical phases match each other between the two photonic waveguide segments. At this point, 50/50 split is achieved with the same propagating mode and the same phase.

In general, for the following reasons it is unpreferable to apply such an ordinary tapered adiabatic coupler as described in Non-Patent Document 3 to Y-branching of an optical device that involves a problem of wavelength dependence of optical loss.

The electric field vectors of TE0 and TE1 at the splitting position (corresponding to the cross-sectional position B of the loop mirror of the present disclosure) of an adiabatic coupler are denoted as $E_{TE0}$ and $E_{TE1}$, and the electric field distribution localized on the respective waveguides are denoted as $e_0$ and $e_1$. The electric field vectors $E_{TE0}$ and $E_{TE1}$ are expressed by Formula (1) using electric field distributions $e_0$ and $e_1$.

When a certain part of the TE0 light incident on the starting position (corresponding to the position of the cross-sectional position A of the loop mirror of the present disclosure) of the adiabatic coupler is converted into TE1 at a conversion ratio η during propagation, the electric field at the cross-sectional position B is expressed by Formula (2), assuming that the phase difference between TE0 and TE1 is θ.

Because, at the cross-sectional position B, the light is split into two components denoted as $e_0$ and $e_1$, the proportions of the respective powers are expressed by Formula (3).

Assuming that η is 1%, for example, the optical loss in the power of TE0 itself is 0.044 dB, which may appear to be negligibly small. However, at the Y-branching position, i.e., the cross-sectional position B, the split ratio is 50±10%, and thus involves a large fluctuations. This is because TE0 and TE1 interfere with each other, and cause fluctuations of the square root of the power ratio η. Since the phase difference e between the two modes has wavelength dependency, the power ratio at the Y-branching position also varies within the range of ±10%, depending on the wavelength.

In contrast, with the optical device 100 of the embodiment, the state of the propagating mode is well considered based upon not only the adiabatic coupler 10, but also upon the entire path including the forward path, the looped waveguide 103, and the return path.

When TE1 mode is produced during propagation of TE0 light on the forward path through the adiabatic coupler 10 of the embodiment, due to influence of perturbation of the waveguide structure having occurred in the manufacturing process or the fluctuation of the refractive index, this TE1 mode will adiabatically follow the effective refractive index line of TE1 illustrated in FIG. 4, and enter the loop 20 at the cross-sectional position B. The TE1 mode having travelled through the loop 20 comes back to the cross-sectional position B and adiabatically follows the effective refractive index line of TE1 in the reverse direction. At position P0, the TE1 mode is localized on the photonic waveguide segment 105.

The TE0 mode light on the other hand, follows the effective refractive index line of TE0 on the return path along the adiabatic coupler 10. The TE0 mode light adiabatically transitions to the TE0 state of the cross-sectional position A, while it is localized on the photonic waveguide segment 102 during propagation. In this way, even if an unintended TE1 is produced due to production error or the like, the state at the cross-sectional position A after reflection from the looped waveguide is such that TE0 exists in the photonic waveguide segment 102, while TE1 exists in the photonic waveguide segment 105, without interfering with each other. Accordingly, the optical device 100 of the embodiment can obviate the technical problem occurring in a typical tapered adiabatic coupler.

Thus, the optical device 100 of the embodiment can overcome the above-described problem arising in Non-Patent Document 3, and is configured to maintain adiabatic transition in one mode. The behavior of the optical device 100 of the embodiment is fundamentally different from those of conventional directional couplers or MMIs disclosed in Patent Documents 1 to 3 which utilize interference of two or more modes.

Although, in FIG. 3A to FIG. 5C, incidence and reflection of TE0 mode are described, other cases using a different propagating mode such as a higher-order TE mode, the fundamental TM mode (TM0), or a higher-order TM mode can also be explained in the similar manner.

Figure 6:
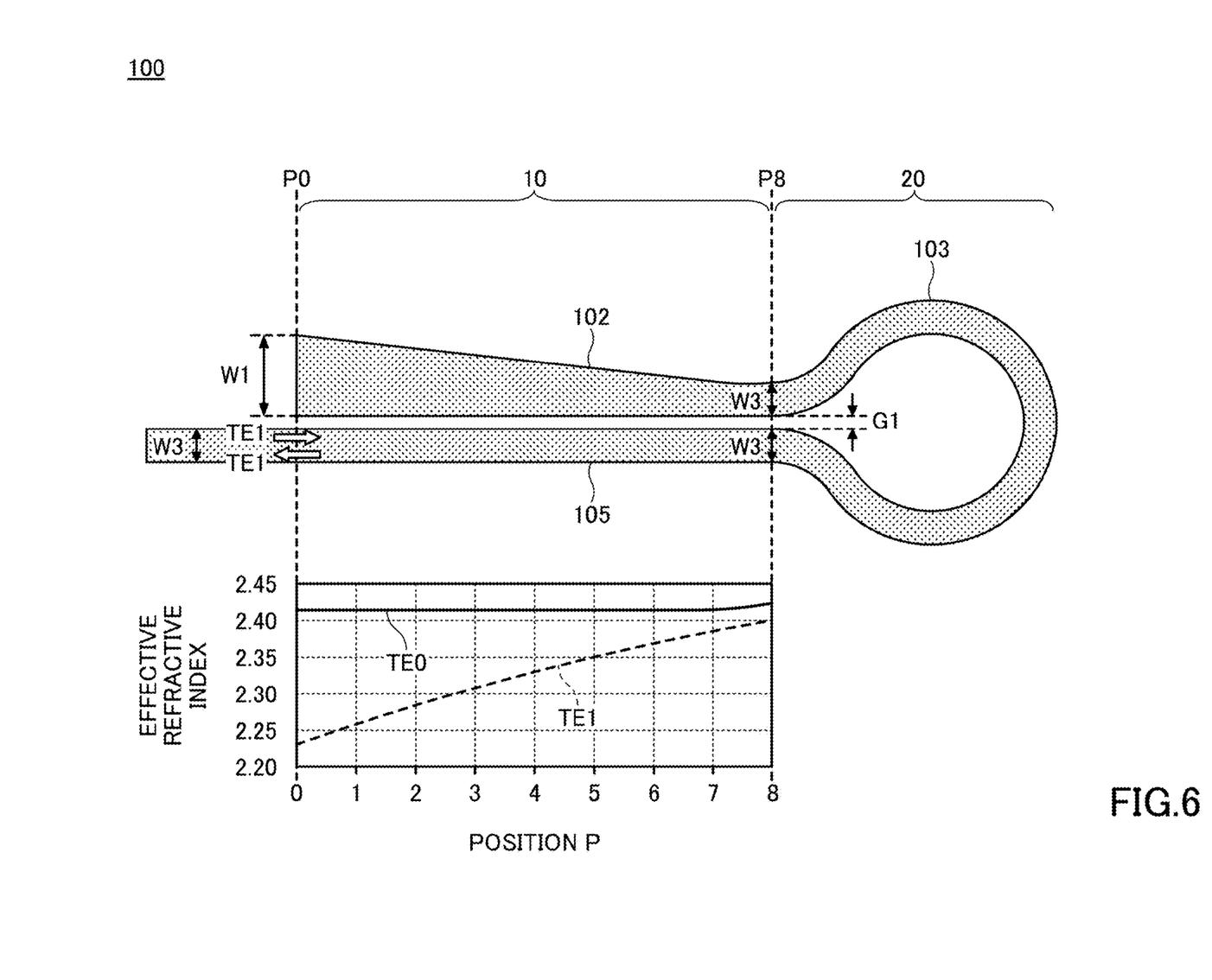
FIG. 6 is a diagram explaining the basic operation of the optical device when handling light of TE1 mode.

FIG. 6 illustrates a behavior of the optical device 100 when handling TE1 mode light. TE1 mode light whose effective refractive index is smaller than TE0 mode with respect to the same medium is introduced from the photonic waveguide segment 105 having a smaller core cross section. The TE1 mode input to the adiabatic coupler 10 transitions from position P0 to position P8 along the effective refractive index line of TE1 (illustrated by the broken line). Since the width of the photonic waveguide segment 102 provided adjacent to the photonic waveguide segment 105 gradually approaches the width W3 of the photonic waveguide segment 105, a part of the TE1 mode light gradually couples to the photonic waveguide segment 102. At position P8, the photonic waveguide segments 105 and 102 have the same cross-sectional shape and size, and TE1 mode exists at the same proportions in the photonic waveguide segments 105 and 102.

Unlike the TE0 light, TE1 light has an antisymmetric electric field distribution in the transverse direction (or the width direction) between adjacent waveguides. Accordingly, the phase of the electric field distribution across the photonic waveguide segments 102 and 105 is shifted by r radians at position P8. In this case, the electric field distribution at the cross-sectional position B after having passed through the looped waveguide 103 is inverted from the electric field distribution of the light incident onto the loop 20, but has the same amplitude of TE1 mode.

On the return path, the TE1 mode travels along the adiabatic coupler 10 in reverse, and at position P0, the electric field of TE1 is localized on the photonic waveguide segment 105. Accordingly, the TE1 light input from the photonic waveguide segment 105 and reflected from the loop 20 is output from the same photonic waveguide segment 105.

Figure 7A:
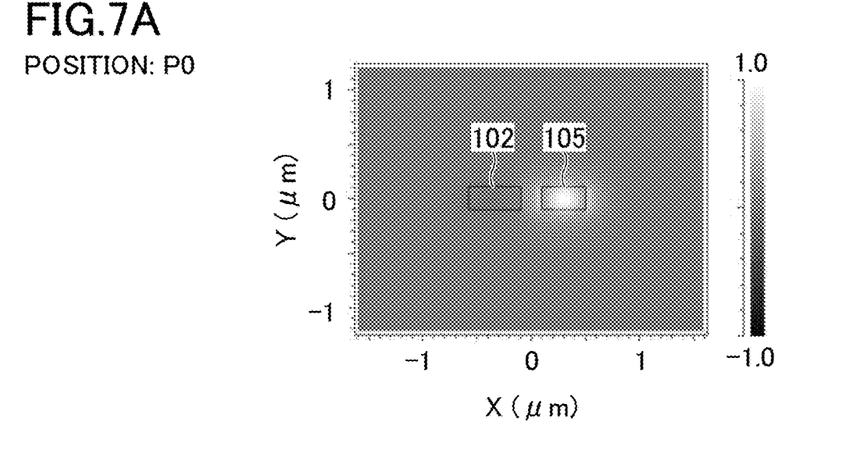
FIG. 7A illustrates a simulation result of the electric field distribution at position P0 of the adiabatic coupler of FIG. 6.
Figure 7B:
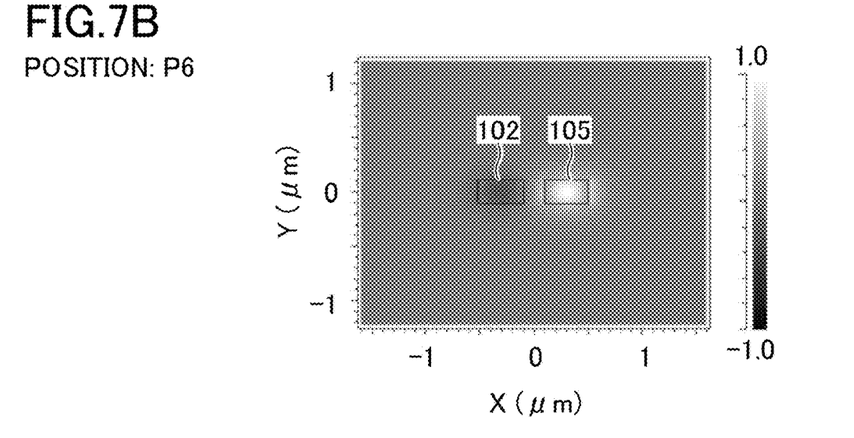
FIG. 7B illustrates a simulation result of the electric field distribution at position P6 of the adiabatic coupler of FIG. 6.
Figure 7C:
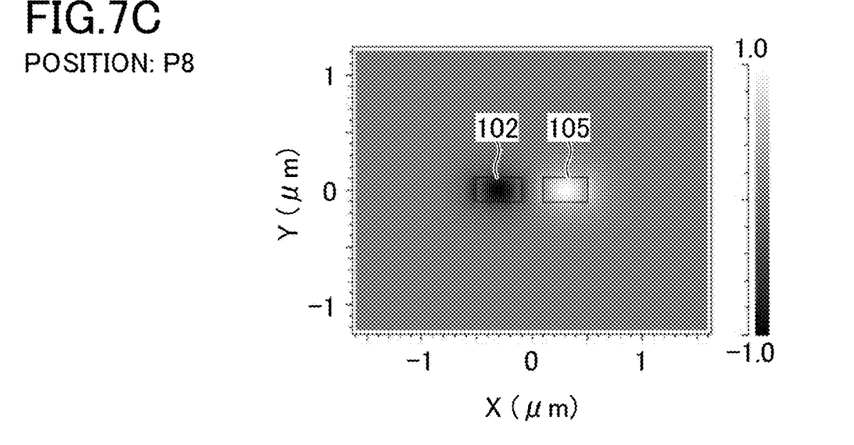
FIG. 7C illustrates a simulation result of the electric field distribution at position P8 of the adiabatic coupler of FIG. 6.

FIG. 7A, FIG. 7B, and FIG. 7C are simulation results of the electric field distribution in the adiabatic coupler 10 at positions P0, P6, and P8, respectively, when TE1 mode is input to the adiabatic coupler 10. The cross sections of FIGS. 7A to 7C are viewed from the incident side of the adiabatic coupler 10, the left rectangle is the core of the tapered photonic waveguide segment 102, whereas the right rectangle is the core of the photonic waveguide segment 105 with a constant width.

At position P0 in FIG. 7A, TE1 light is incident on the photonic waveguide segment 105 having a smaller core cross section. The TE1 electric field is localized on the photonic waveguide segment 105.

At position P6 in FIG. 7B, the width of the photonic waveguide segment 102 becomes closer to that of the photonic waveguide segment 105, and the evanescent light of TE1 at the core-clad interface of the photonic waveguide segment 105 is coupled to the photonic waveguide segment 102.

At position P8 in FIG. 7C, the cross-sectional shape and size of the photonic waveguide segment 102 become the same as those of the photonic waveguide segment 105. The TE1 mode is an odd mode. The amplitude is the same between the two waveguide segments, but n-radian optical phase difference exists between the two waveguide segments. For this reason, the electric field distribution on the photonic waveguide segment 102 is inverted to the negative side, and is indicated darkly. Again, the optical power or energy of the incident light is conserved on the return path after having travelled through the looped waveguide 103. The TE1 mode travels through the adiabatic coupler 10 in reverse, and output from the photonic waveguide segment 105.

Figure 8:
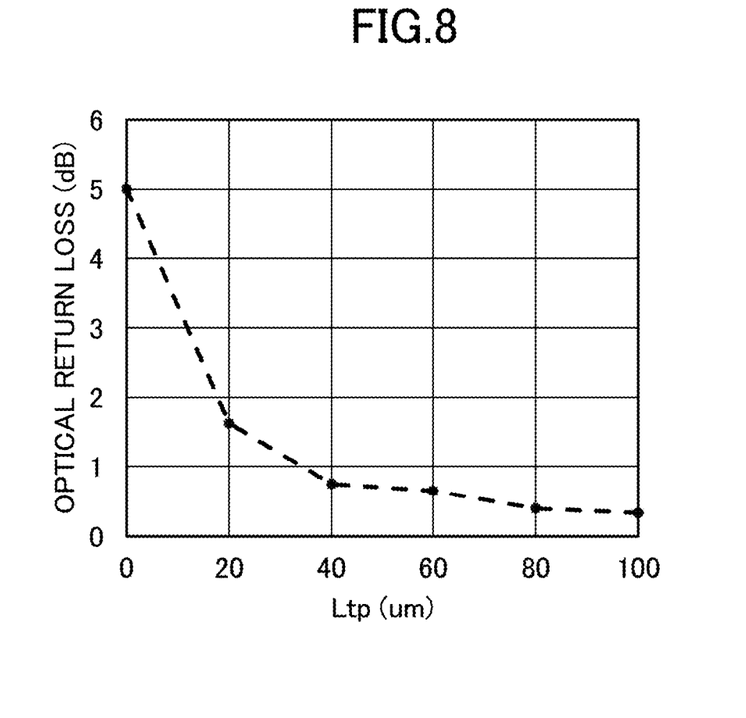
FIG. 8 illustrates a preferable range of the length of the adiabatic coupler used in an optical device.

FIG. 8 illustrates a preferable range of the length of the adiabatic coupler 10 used in the optical device 100. The horizontal axis represents physical length $L_{tp}$ (μm) of the adiabatic coupler 10, and the vertical axis represents optical return loss (dB). Since the effective length of the adiabatic coupler 10 becomes longer as the wavelength shifts to the short side, the optical return loss is calculated for wavelength of 1520 nm in the optical communication band.

Referring back to FIG. 2, the optical return loss at 1520 nm is 0.6 dB. In order to achieve a loss lower than this level, it is preferable in FIG. 8 that $L_{tp}$ is 70 μm or longer. It is more preferable that $L_{tp}$ is equal to or greater than 80 μm, and 100 μm or longer is still more preferable. When $L_{tp}$ is 80 μm, the optical loss becomes 0.40 dB or less over the currently available optical communication band. When $L_{tp}$ is 100 μm, the optical loss becomes 0.34 dB or less over the currently available optical communication band, and optical return loss of the optical device 100 can be sufficiently reduced.

When the physical length $L_{tp}$ of the adiabatic coupler 10 becomes too long, down-sizing of the optical device 100 becomes difficult. Besides, from the tendency of the change in the optical return loss in FIG. 8, it is inferred that the optical loss reducing effect is saturated when the $L_{tp}$ reaches a certain length. Therefore, the preferred range of $L_{tp}$ is 70 μm to 120 μm, more preferably 80 to 100 μm.

Figure 9:
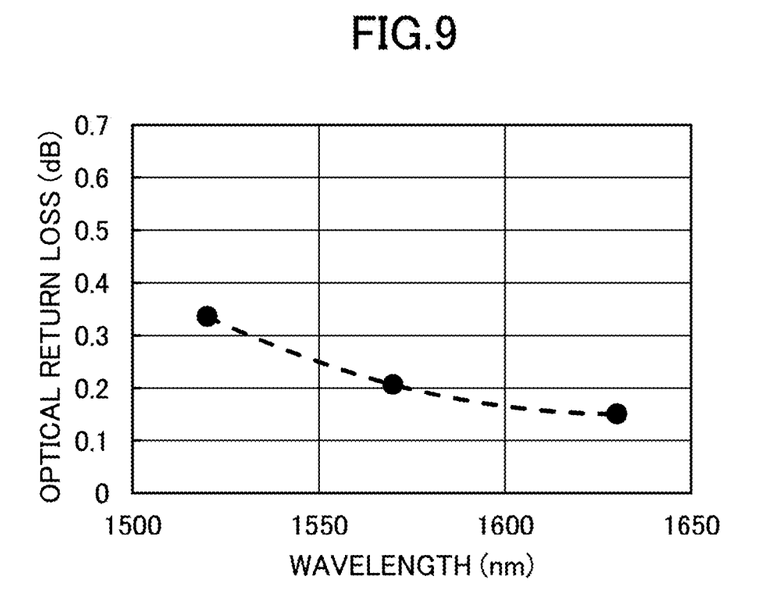
FIG. 9 illustrates an advantageous effect of the configuration of the embodiment.

FIG. 9 illustrates one of the advantageous effects of the configuration of the embodiment. This diagram presents a calculation result of wavelength dependence of optical return loss where the physical length $L_{tp}$ of the adiabatic coupler 10 is set to 100 μm. In a wide wavelength range of 1520 nm to 1630 nm including the C band and the L band, the optical return loss becomes 0.34 dB or less, and an optical device 100 with reduced loess is achieved.

In FIG. 2, which illustrates optical return loss of the conventional configuration of FIG. 1, the changing rate of the optical return loss with respect to the change in wavelength is large, and the maximum reflection loss is as great as 0.61 dB. There is a 0.60 dB difference between the maximum and the minimum of the optical return loss.

In contrast, in the optical device 100 of the embodiment, the variation range of the optical return loss with $L_{tp}$ set to 100 μm is 0.19 dB, and the wavelength dependence of optical return loss is greatly improved.

<Modifications>

Figure 10:
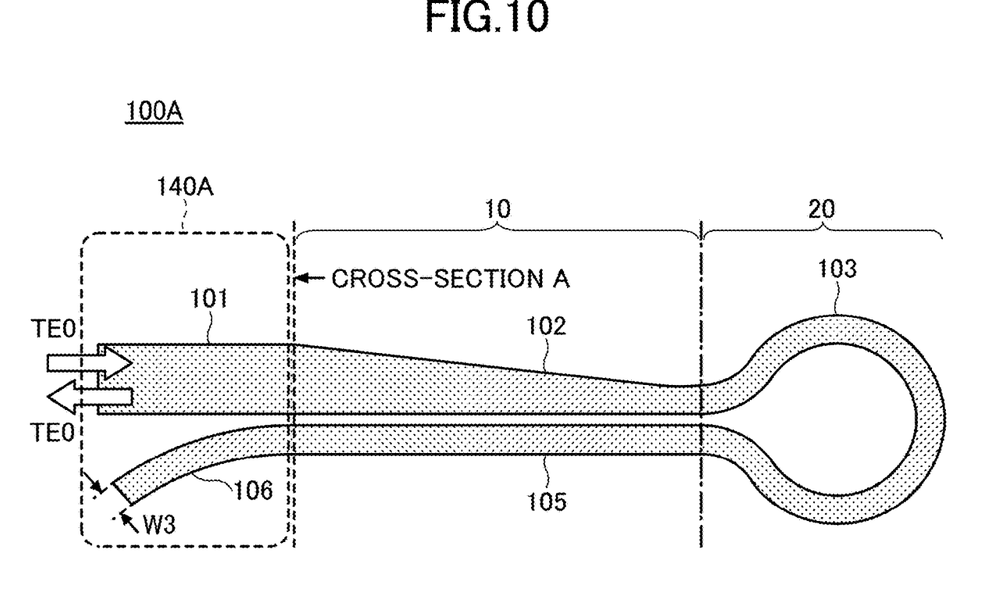
FIG. 10 illustrates a modification of the optical device according to the embodiment.

FIG. 10 is a schematic diagram of an optical device 100A, which is a modification of the optical device 100. The optical device 100A is configured to receive and reflect TE0 light, and has an input/output structure 140A at the side opposite to the loop 20.

A photonic waveguide segment 101 of the input/output structure 140A introduces TE0 mode into the photonic waveguide segment 102 of the adiabatic coupler 10 and outputs the reflected light of TE0 mode propagating from the photonic waveguide segment 102.

The input/output structure 140A has a straight photonic waveguide segment 101 that continues at the cross-sectional position A from the photonic waveguide segment 102, and has a curved photonic waveguide segment 106 that continues at the cross-sectional position A from the photonic waveguide segment 105. The width of the curved photonic waveguide segment 106 is W3.

Viewing in the incident direction into the optical device 100A, the straight photonic waveguide segment 101 and the curved photonic waveguide segment 106 come closer to each other toward the cross-sectional position A. More specifically, the curved photonic waveguide segment 106 is configured to gradually approach the straight photonic waveguide segment 101.

By providing the curved photonic waveguide segment 106, discontinuity of the change in the cross-sectional shapes of the two adjacent waveguides with respect to the light propagation direction can be mitigated, and the likelihood of creation of TE1 mode during propagation of TE0 light is reduced.

Generally, bending a waveguide causes an optical loss, but the photonic waveguide segment 101 used for inputting and outputting TE0 light, and the photonic waveguide segment 102 continuing from the photonic waveguide segment 101 are maintained straight. On the other hand, the curved photonic waveguide segment 106 continuing to the photonic waveguide segment 105 is designed so as to gradually approach the photonic waveguide segment 101. This configuration can prevent the cross-sectional layout of the two adjacent waveguides from being suddenly interrupted at the cross-sectional position A.

Figure 11:
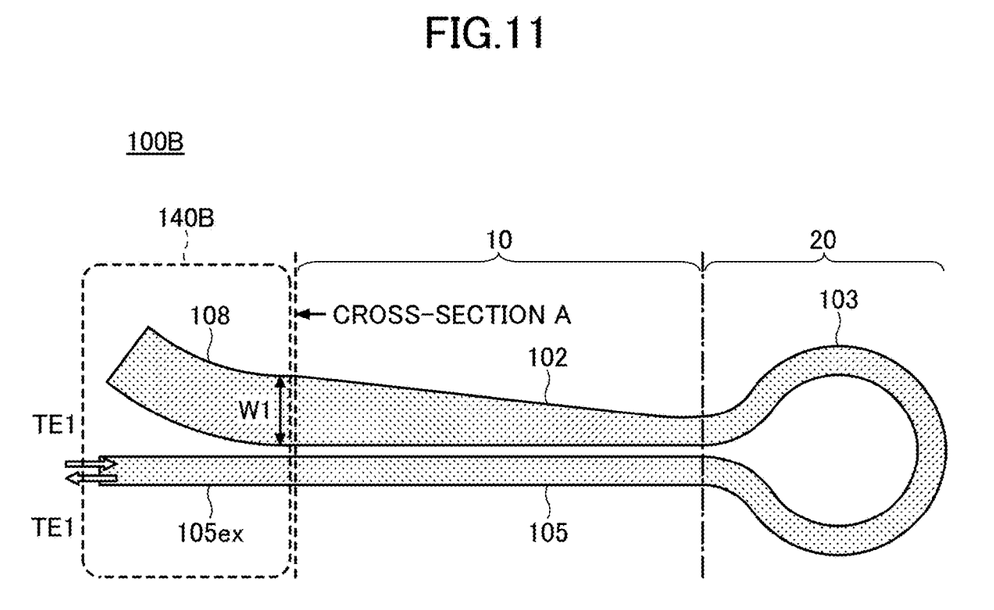
FIG. 11 is a diagram explaining the basic operation of the optical device of FIG. 10 when handling light of TE1 mode.

FIG. 11 is a schematic diagram of an optical device 100B and is another modification of the optical device 100. The optical device 100B is configured to receive and reflect TE1 light, and has an input/output structure 140B at the side opposite to the loop 20.

The input/output structure 140B has a straight photonic waveguide segment 105ex that continues at the cross-sectional position A from the photonic waveguide segment 105, and has a curved photonic waveguide segment 108 that continues at the cross-sectional position A from the photonic waveguide segment 102. The width of the curved photonic waveguide segment 108 is W1 and this is the same width as that of the photonic waveguide segment 102 at the cross-sectional position A.

Viewing in the incident direction into the optical device 100B, the straight photonic waveguide segment 105ex and the curved photonic waveguide segment 10 come closer to each other toward the cross-sectional position A. More specifically, the curved photonic waveguide segment 108 is configured to gradually approach the straight photonic waveguide segment 105ex.

By providing the curved photonic waveguide segment 108, discontinuity of the change in the cross-sectional shape of the two adjacent waveguides with respect to the light propagation direction can be mitigated, and the likelihood of creation of TE0 mode during propagation of TE1 light is reduced.

Figure 12:
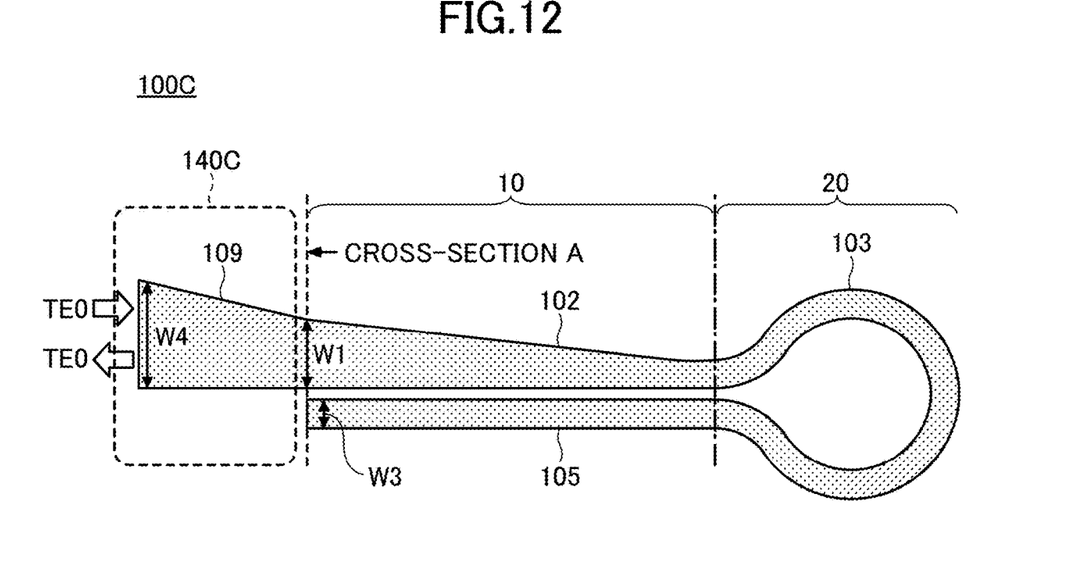
FIG. 12 illustrates another example of modified configuration of the optical device of the embodiment.

FIG. 12 is a schematic diagram of an optical device 100C and is still another modification of the optical device 100. The optical device 100C is configured to receive and reflect TE0 light, and it has an input/output structure 140C at the opposite side of the loop 20.

The input/output structure 140C has a tapered photonic waveguide segment 109 which continuously extends from the photonic waveguide segment 102 of the adiabatic coupler 10. The tapered photonic waveguide segment 109 is configured to input and output the TE0 light to and from the photonic waveguide segment 102. The width of the tapered photonic waveguide segment 109 varies along the optical axis at a changing rate different from the photonic waveguide segment 102. The width of the tapered photonic waveguide segment 109 is W1 at the cross-sectional position A, and W4 (W4>W1) at the opposite end.

By providing the tapered photonic waveguide segment 109, low-loss connection between the optical device 100C and other optical circuit elements or photonic waveguides provided on or outside the substrate 110 can be achieved.

When applying the configuration of FIG. 12 to that of FIG. 11, the tapered photonic waveguide segment 109 may be connected to the photonic waveguide segment 105ex through which TE1 light is introduced or output. In this configuration, the optical device 100B can be connected at low loss with other optical circuit elements or photonic waveguides provided on or outside the substrate 110.

Figure 13:
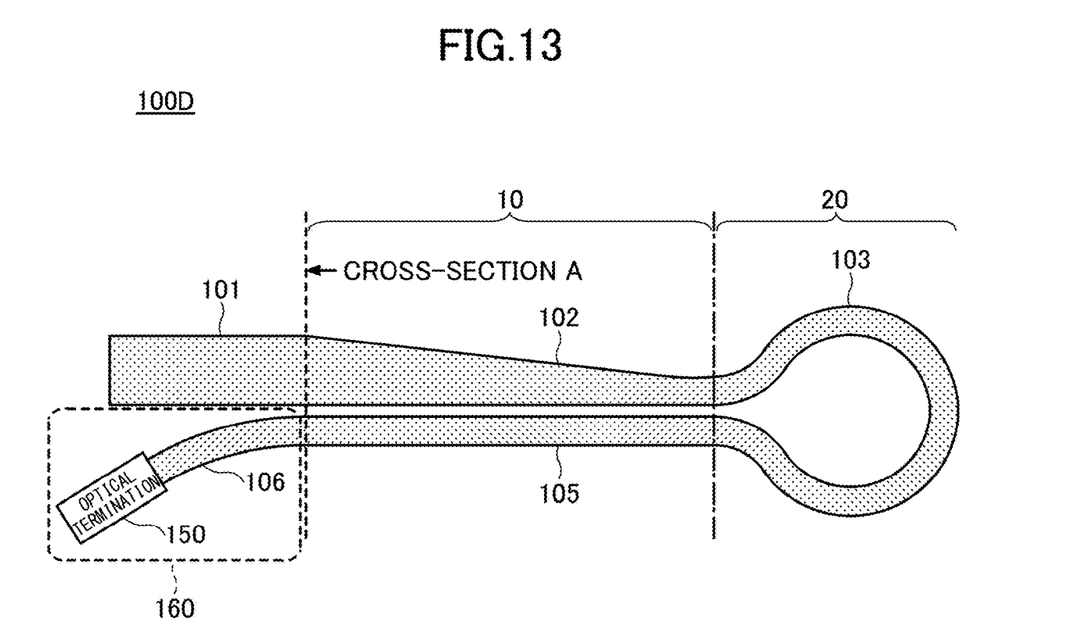
FIG. 13 illustrates yet another example of modified configuration of the optical device of the embodiment.

FIG. 13 is a schematic diagram of an optical device 100D, which is still another modification of the optical device 100. The optical device 100D has a terminal structure 160 at the side opposite to the loop 20. The optical device 100D is configured to receive and reflect TE0 light, and an optical termination 150 may be connected to the curved photonic waveguide segment 106 used in the optical device 100A of FIG. 10.

When inputting TE0 light, it is preferable to provide the terminal structure 160 on the side of the photonic waveguide segment 105 in which TE1 mode is localized for a following reason.

TE1 mode, which may be generated during propagation of TE0 mode due to the perturbation of the waveguide structure in the manufacturing process or the fluctuation of the refractive index of the core/clad materials, is localized in the photonic waveguide segment 105 at the cross-sectional position A. Without the optical termination 150, the localized TE1 might be reflected from the cross-sectional position A into the tapered photonic waveguide segment 102. The reflected TE1 travels through the looped waveguide 103 and the photonic waveguide segment 105, and appears again at the cross-sectional position A. This means that the TE1 mode remains in the reflector circulating along the loop. There is a possibility that the remaining TE1 will be converted into TE0 due to the influence of the perturbation or the like, and that the converted TE0 will interfere with the target signal and deteriorate the characteristic, such as wavelength dependence of optical return loss, of the reflector. To avoid such inconvenience, undesirable TE1 is removed at the optical termination 150 to keep the characteristic of the optical device 100D satisfactory.

In order to reduce adverse influence on the photonic waveguide segment 102 which serves as an optical input/ output, it is desirable to provide the optical termination 150 away from the photonic waveguide segment 102. Accordingly, the optical termination 150 is connected to the curved photonic waveguide segment 106 in this example. When adopting a configuration for receiving and reflecting TE1 light, an optical termination 150 may be connected to the curved photonic waveguide segment 108 illustrated in FIG. 11.

Figure 14A:
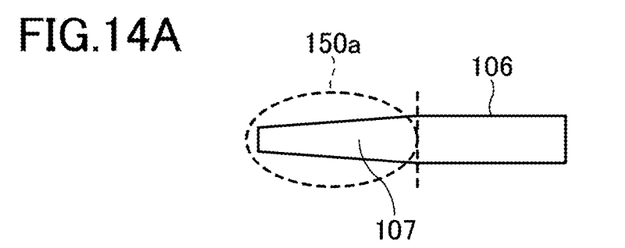
FIG. 14A illustrates an example of an optical termination of the optical device of FIG. 13.
Figure 14B:
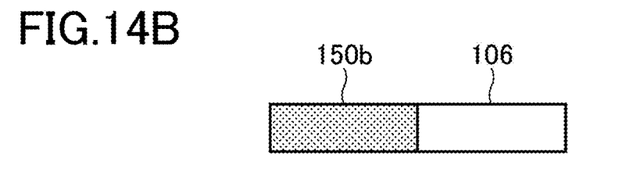
FIG. 14B illustrates another example of the optical termination of the optical device of FIG. 13.
Figure 14C:
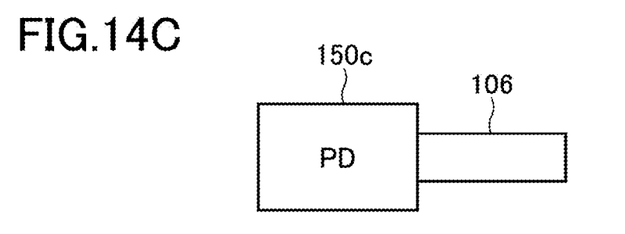
FIG. 14C illustrates still another example of the optical termination of the optical device of FIG. 13.

FIG. 14A to FIG. 14C illustrate examples of the optical termination 150. In FIG. 14A, the optical termination is implemented by a tapered structure 150a. In this case, the end portion of the curved photonic waveguide segment 106 may be shaped into a tapered waveguide 107. By gradually reducing the width of the tapered waveguide 107, unnecessary TE1 component is radiated. The tapered shape has another advantageous effect of suppressing undesired reflection. Although, in FIG. 14A to FIG. 14C, the end portion of the curved photonic waveguide segment 106 is depicted as a straight line for convenience of illustration, the curved photonic waveguide segment 106 is bending in the actual structure toward the cross-sectional position A as illustrated in FIG. 13.

In FIG. 14B, the optical termination is implemented by a highly doped region 150b. For example, the tip portion of the curved photonic waveguide segment 106 may be doped with a substance that causes light absorption. In this case, the TE1 mode light localized in the photonic waveguide segment 105 is absorbed at the optical termination implemented by the highly doped region 150b.

In FIG. 14C, the optical termination is implemented by a photodiode (PD) 150c. Unnecessary TE1 mode light is converted into a photocurrent and removed from the optical device 100D. The optical termination is not limited to the above described example, and any suitable structure may be employed as long as it can prevent the optical power from returning to the reflector, i.e., the optical device 100.

In the above-described embodiments and modifications, the material used for the photonic waveguide is not limited to the Si core and the $SiO_2$ cladding. The present disclosure is applicable to an optical device fabricated by a planar lightwave circuit (PLC) formed of quartz, or an optical device having a photonic waveguide formed of a compound semiconductor material such as InP or GaAs.

The shape of the photonic waveguide is not limited to the rectangular Si core, and a photonic waveguide of a rib type or a ridge type may be used.

Any of the modifications illustrated in FIG. 10 to FIG. 13 may be combined as appropriate. For example, in FIG. 10, the tapered photonic waveguide segment 109 of FIG. 12 may be connected at the cross-sectional position A to the photonic waveguide segment 102, in place of the photonic waveguide segment 101 for inputting and outputting TE0 light. In FIG. 11, the tapered photonic waveguide segment 109 of FIG. 12 may be connected at the cross-sectional position A to the photonic waveguide segment 105, in place of the photonic waveguide segment 105ex.

<Application to Light Source Module>

Figure 15:
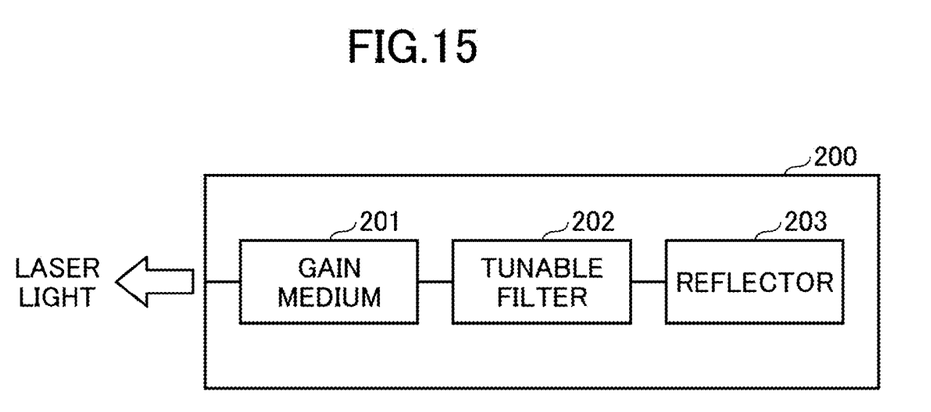
FIG. 15 is a schematic block diagram of a light source module using the optical device of the embodiment.

FIG. 15 is a schematic block diagram of a light source module 200 using any one of the optical devices 100 and 100A to 100D of the embodiments.

The light source module 200 is, for example, a tunable laser diode, and it has a gain medium 201, a tunable filter 202, and a reflector 203 to which the optical device 100 is applied.

The gain medium 201 may be any suitable medium that can create population inversion by stimulated emission, including a semiconductor optical amplifier (SOA) and a laser medium. When the active layer of the gain medium 201 is formed of single-layer or multi-layer quantum well or quantum dot of a compound semiconductor, the gain medium 201 may be mounted on a silicon photonics chip or a PLC substrate, and optically connected to the tunable filter 202.

The tunable filter 202 may be formed of, for example, a Si photonic waveguide fabricated on the substrate 110 (see FIG. 3). The tunable filter 202 may be implemented by a ring resonator formed of a Si photonic waveguide, and a heater for controlling the resonance peak wavelength of the ring resonator to a target wavelength.

The reflector 203 is connected to the tunable filter 202 and serves as a reflecting end of an external resonator. When the optical device 100 of the embodiment is used as the reflector 203, light of the TE0 mode, output from the tunable filter 202, may be input to the photonic waveguide segment 102 at the cross-sectional position A of the optical device 100. The incident TE0 mode transitions adiabatically to the state of the cross-sectional position B, while maintaining the TE0 mode, during propagation through the adiabatic coupler 10. The TE0 light then travels around the looped waveguide 103, returns to the cross-sectional position B, and follows the adiabatic coupler 10 in the reverse direction. The TE0 light is finally reflected from the photonic waveguide segment 102 to the tunable filter 202.

In the reflector 203, the optical return loss and the wavelength dependence are satisfactorily reduced over a broad wavelength band used in a fiber-optic communication system. The light source module 200 has high energy efficiency and can oscillate in a stable manner at the target wavelength.

The present disclosure is not limited to the above-described exemplified configurations. At least one of two photonic waveguides extending side by side may be fabricated into a tapered structure in which the width or the cross-sectional shape changes gradually and continuously along the optical axis. The tapered structure does not necessarily have to narrow toward the loop 20, as long as the cross-sectional shapes of the two photonic waveguide segments extending side by side are different or incongruent at position P0 of the adiabatic coupler 10, and becomes congruent (with the same shape and the same size) at position P8 connected to the looped waveguide. The width of at least one photonic waveguide segment may be gradually widened toward the loop 20, or may be narrowed continuously in width after the width has been increased to a certain extent.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:
1. An optical device comprising:
   a first photonic waveguide provided on a substrate;
   a second photonic waveguide provided on the substrate and extending side by side with the first photonic waveguide; and a looped waveguide continuously connecting the first photonic waveguide and the second photonic waveguide on the substrate, wherein a width of at least one of the first photonic waveguide or the second photonic waveguide varies continuously along an optical axis, between a first position located at a side opposite to the looped waveguide and a second position connected to the looped waveguide, and wherein cross sections of the first photonic waveguide and the second photonic waveguide are congruent at the second position, and are incongruent at the first position, such that the first photonic waveguide and the second photonic waveguide form an adiabatic coupler connected to the looped waveguide.

2. The optical device as claimed in claim 1, wherein the first photonic waveguide and the second photonic waveguide gradually come closer to each other in an incident direction to the optical device, from a position before the first position toward the first position.

3. The optical device as claimed in claim 1,
wherein at the first position, the first photonic waveguide is connected to a constant-width photonic waveguide configured to input a light of a first propagating mode to the optical device, and
wherein at the first position, the second photonic waveguide is connected to a curved waveguide that gradually approaches the straight photonic waveguide.

4. The optical device as claimed in claim 1,
wherein at the first position, the second photonic waveguide is connected to a straight photonic waveguide configured to input a light of a second propagating mode to the optical device, and
wherein at the first position, the first photonic waveguide is connected to a curved waveguide that gradually approaches the straight photonic waveguide.

5. The optical device as claimed in claim 1,
wherein at the first position, at least one of the first photonic waveguide or the second photonic waveguide is connected to a tapered waveguide whose width gradually changes along the optical axis.

6. The optical device as claimed in claim 1,
wherein at the first position, one of the first photonic waveguide and the second photonic waveguide is connected to an input/output waveguide configured to input and output light to and from the optical device, and the other is optically terminated.

7. The optical device as claimed in claim 1,
wherein a length of the first photonic waveguide and the second waveguide is 70 microns to 120 microns.

8. The optical device as claimed in claim 1,
wherein the first photonic waveguide or the second photonic waveguide is configured to branch a light into two at an even proportion at the second position, without changing a propagating mode of the light incident at the first position on the optical device.

9. A light source module comprising:
a gain medium;
a tunable filter connected to the gain medium; and
an optical device connected to the tunable filter, the optical device having a first photonic waveguide provided on a substrate, a second photonic waveguide provided on the substrate and extending side by side with the first photonic waveguide, and a looped waveguide continuously connecting the first photonic waveguide and the second photonic waveguide on the substrate, wherein a width of at least one of the first photonic waveguide or the second photonic waveguide varies continuously along an optical axis, between a first position located at a side opposite to the looped waveguide and a second position connected to the looped waveguide, and wherein cross sections of the first photonic waveguide and the second photonic waveguide are congruent at the second position, and are incongruent at the first position, such that the first photonic waveguide and the second photonic waveguide form an adiabatic coupler connected to the looped waveguide.

10. An optical device comprising:
a first photonic waveguide provided on a substrate;
a second photonic waveguide provided on the substrate and extending side by side with the first photonic waveguide; and
a looped waveguide continuously connecting the first photonic waveguide and the second photonic waveguide on the substrate, wherein a width of at least one of the first photonic waveguide or the second photonic waveguide varies continuously along an optical axis, between a first position located at a side opposite to the looped waveguide and a second position connected to the looped waveguide, and wherein cross sections of the first photonic waveguide and the second photonic waveguide are congruent at the second position, and are incongruent at the first position, while keeping a substantially constant gap between the first photonic waveguide and the second photonic waveguide.

* * * * *